US008309374B2

(12) United States Patent
Porthouse et al.

(10) Patent No.: US 8,309,374 B2
(45) Date of Patent: Nov. 13, 2012

(54) ADVANCED PLATFORM FOR PROCESSING CRYSTALLINE SILICON SOLAR CELLS

(75) Inventors: Keith Brian Porthouse, Sunnyvale, CA (US); Peter G. Borden, San Mateo, CA (US); Tristan R. Holtam, Saratoga, CA (US); Lisong Zhou, Sunnyvale, CA (US); Ian Scott Latchford, Palo Alto, CA (US); Derek Aqui, Portland, OR (US); Vinay K. Shah, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 656 days.

(21) Appl. No.: 12/575,088

(22) Filed: Oct. 7, 2009

(65) Prior Publication Data
US 2010/0087028 A1 Apr. 8, 2010

Related U.S. Application Data

(60) Provisional application No. 61/103,498, filed on Oct. 7, 2008.

(51) Int. Cl.
*H01L 21/00* (2006.01)
*H01L 21/677* (2006.01)

(52) U.S. Cl. .......................... 438/19; 414/217
(58) Field of Classification Search ............. 438/19, 438/800; 414/217
See application file for complete search history.

(56) References Cited

U.S. PATENT DOCUMENTS

| | | | |
|---|---|---|---|
| 5,248,349 A | 9/1993 | Foote et al. | |
| 5,658,114 A | 8/1997 | Mahler | |
| 6,077,722 A | 6/2000 | Jansen et al. | |
| 6,092,669 A | 7/2000 | Kushiya et al. | |
| 6,177,129 B1 | 1/2001 | Wagner et al. | |
| 6,235,634 B1 | 5/2001 | White et al. | |
| 6,288,325 B1 | 9/2001 | Jansen et al. | |
| 6,579,052 B1 * | 6/2003 | Bonora et al. | 414/222.01 |
| 6,784,361 B2 | 8/2004 | Carlson et al. | |
| 7,819,079 B2 * | 10/2010 | Englhardt et al. | 118/500 |
| 7,897,525 B2 * | 3/2011 | Lei et al. | 438/800 |
| 2003/0044539 A1 | 3/2003 | Oswald | |
| 2007/0237608 A1 * | 10/2007 | Jang et al. | 414/217 |
| 2007/0274814 A1 * | 11/2007 | Kawasaki et al. | 414/217.1 |
| 2008/0304940 A1 * | 12/2008 | Auer-Jongepier et al. | 414/152 |
| 2009/0077805 A1 | 3/2009 | Bachrach et al. | |

FOREIGN PATENT DOCUMENTS

| | | |
|---|---|---|
| JP | 2000150389 A | 5/2000 |
| JP | 2001210691 A | 8/2001 |
| KR | 20070114435 A | 12/2007 |
| WO | WO 2008/140224 | 11/2008 |

OTHER PUBLICATIONS

PCT International Search Report and Written Opinion dated May 17, 2010 for International Application No. PCT/US2009/059782.

* cited by examiner

*Primary Examiner* — William D Coleman
(74) *Attorney, Agent, or Firm* — Patterson & Sheridan, LLP

(57) ABSTRACT

The present invention generally provides a batch substrate processing system, or cluster tool, for in-situ processing of a film stack used to form regions of a solar cell device. In one configuration, the film stack formed on each of the substrates in the batch contains one or more silicon-containing layers and one or more metal layers that are deposited and further processed within the various chambers contained in the substrate processing system. In one embodiment, a batch of solar cell substrates is simultaneously transferred in a vacuum or inert environment to prevent contamination from affecting the solar cell formation process.

25 Claims, 9 Drawing Sheets

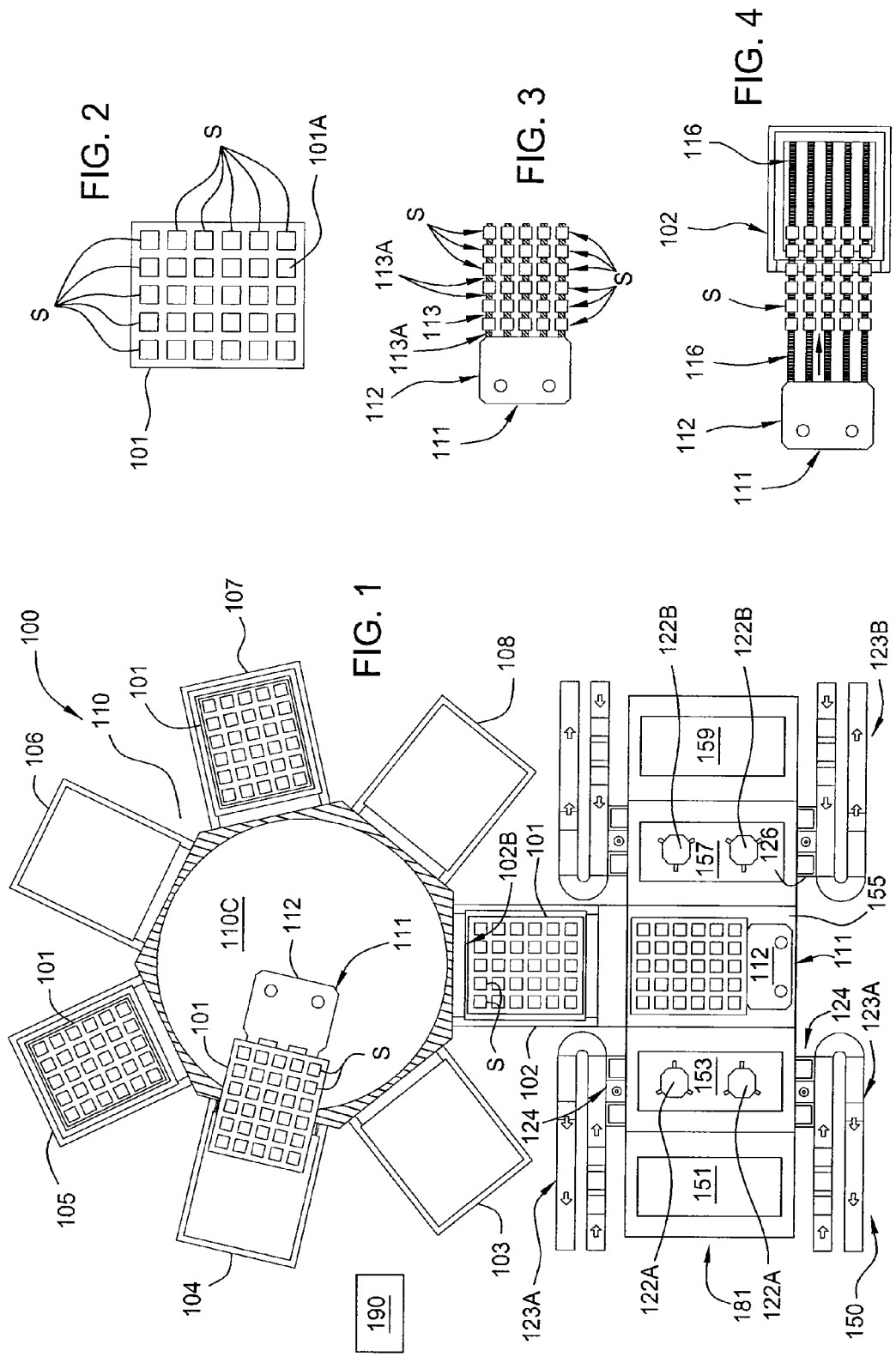

ADVANCED PLATFORM FOR PROCESSING CRYSTALLINE SILICON SOLAR CELLS

CROSS-REFERENCE TO RELATED APPLICATIONS

This application claims benefit of U.S. Provisional Patent Application Ser. No. 61/103,498, filed Oct. 7, 2008, which is herein incorporated by reference in its entirety.

BACKGROUND OF THE INVENTION

1. Field of the Invention

Embodiments of the invention generally relate to an apparatus and method for forming a solar cell device. The invention is particularly useful for fabrication of crystalline silicon solar cells processed in batches arranged in planar arrays.

2. Description of the Related Art

Photovoltaic (PV) or solar cells are devices which convert sunlight into direct current (DC) electrical power. A typical PV cell includes a p-type silicon wafer, or substrate, typically less than about 0.3 mm thick, with a thin layer of an n-type silicon material disposed on top of the p-type substrate. The generated voltage, or photo-voltage, and generated current by the PV cell are dependent on the material properties of the p-n junction, the interfacial properties between deposited layers, and the surface area of the device. When exposed to sunlight (consisting of energy from photons), the p-n junction of the PV cell generates pairs of free electrons and holes. An electric field formed across a depletion region of the p-n junction separates the free electrons and holes, creating a voltage. A circuit from n-side to p-side allows the flow of electrons when the PV cell is connected to an electrical load. Electrical power is the product of the voltage times the current generated as the electrons and holes move through the external electrical load and eventually recombine. Each solar cell generates a specific amount of electrical power. A plurality of solar cells are tiled into modules sized to deliver the desired amount of system power.

The PV market has experienced growth with annual growth rates exceeding above 30% for the last ten years. Some articles have suggested that solar cell power production world wide may exceed 10 GWp in the near future. It has been estimated that more than 90% of all photovoltaic modules are silicon wafer based. The high market growth rate in combination with the need to substantially reduce solar electricity costs has resulted in a number of serious challenges for silicon wafer production development for photovoltaics.

In order to meet these challenges, the following solar cell processing requirements generally need to be met: 1) the cost of ownership (CoO) for substrate fabrication equipment needs to be improved (e.g., high system throughput, high machine up-time, inexpensive machines, inexpensive consumable costs), 2) the area processed per process cycle needs to be increased (e.g., reduce processing per Wp) and 3) the quality of the formed layers and film stack formation processes needs to be well controlled and be sufficient to produce highly efficient solar cells. Therefore, there is a need to cost effectively form and manufacture silicon sheets for solar cell applications.

Further, as the demand for solar cell devices continues to grow, there is a trend to reduce cost by increasing the substrate throughput and improving the quality of the deposition processes performed on the substrate. However, the cost associated with producing and supporting all of the processing components in a solar cell production line continues to escalate dramatically. To reduce this cost while also reducing surface contamination, it is desirable to design a novel solar cell processing system configuration and processing sequence to eliminate and/or combine processing steps and to accommodate sequential processing steps in the processing system that has a high throughput, improved device yield, and a compact footprint.

SUMMARY OF THE INVENTION

In one embodiment of the present invention, a processing system comprises a transfer chamber having a first transfer robot disposed therein, wherein the first transfer robot is configured to transfer an array of substrates, a first process chamber coupled to the transfer chamber and having a substrate supporting surface configured to receive the array of substrates from the first transfer robot, a second process chamber coupled to the transfer chamber and having a substrate supporting surface configured to receive the array of substrates from the first transfer robot, a load lock chamber coupled to the transfer chamber and having one or more regions with a substrate supporting surface configured to receive the array of substrates from the first transfer robot, and a substrate interface module having a second transfer robot configured to transfer the array of substrates between the substrate interface module and the one or more regions of the load lock chamber.

In another embodiment of the present invention, a processing system comprises a first transfer chamber having a first transfer robot disposed therein, wherein the first transfer robot is configured to transfer an array of substrates, a first process chamber coupled to the first transfer chamber and having a substrate supporting surface configured to receive the array of substrates from the first transfer robot, a second process chamber coupled to the first transfer chamber and having a substrate supporting surface configured to receive the array of substrates from the first transfer robot, a second transfer chamber having a second transfer robot disposed therein, wherein the second transfer robot is configured to transfer the array of substrates, a pass through chamber coupling the first transfer chamber and the second transfer chamber, wherein each of the first and second transfer robots is configured to transfer the array of substrates to the pass through chamber and receive the array of substrates from the pass through chamber, a load lock chamber coupled to the first transfer chamber and having one or more regions with a substrate supporting surface configured to receive the array of substrates from the first transfer robot, and a substrate interface module having a third transfer robot configured to transfer the array of substrates between the substrate interface module and the one or more regions of the load lock chamber.

In yet another embodiment of the present invention, a method of forming a solar cell device comprises positioning an array of substrates on an end effector of a transfer robot within a transfer chamber, transferring the array of substrates into a first processing chamber coupled to the transfer chamber, processing a first side of each of the array of substrates in the first processing chamber, transferring the array of substrates into a reorientation chamber coupled to the transfer chamber, substantially simultaneously reorienting each substrate such that the first side faces downwardly, transferring the array of substrates into a third processing chamber coupled to the transfer chamber, and processing a second side of each of the array of substrates in the third processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is schematic plan view of one embodiment of a substrate processing system according to one embodiment described herein.

FIG. 2 is a schematic plan view of a substrate carrier according to one embodiment described herein.

FIG. 3 is a schematic plan view of an end effector for use in transferring a batch of substrates according to one embodiment described herein.

FIG. 4 is a schematic plan view of an end effector for use in transferring a batch of substrates according to another embodiment described herein.

For clarity, identical reference numerals have been used, where applicable, to designate identical elements that are common between figures. It is contemplated that features of one embodiment may be incorporated in other embodiments without further recitation.

DETAILED DESCRIPTION

Figure 5:
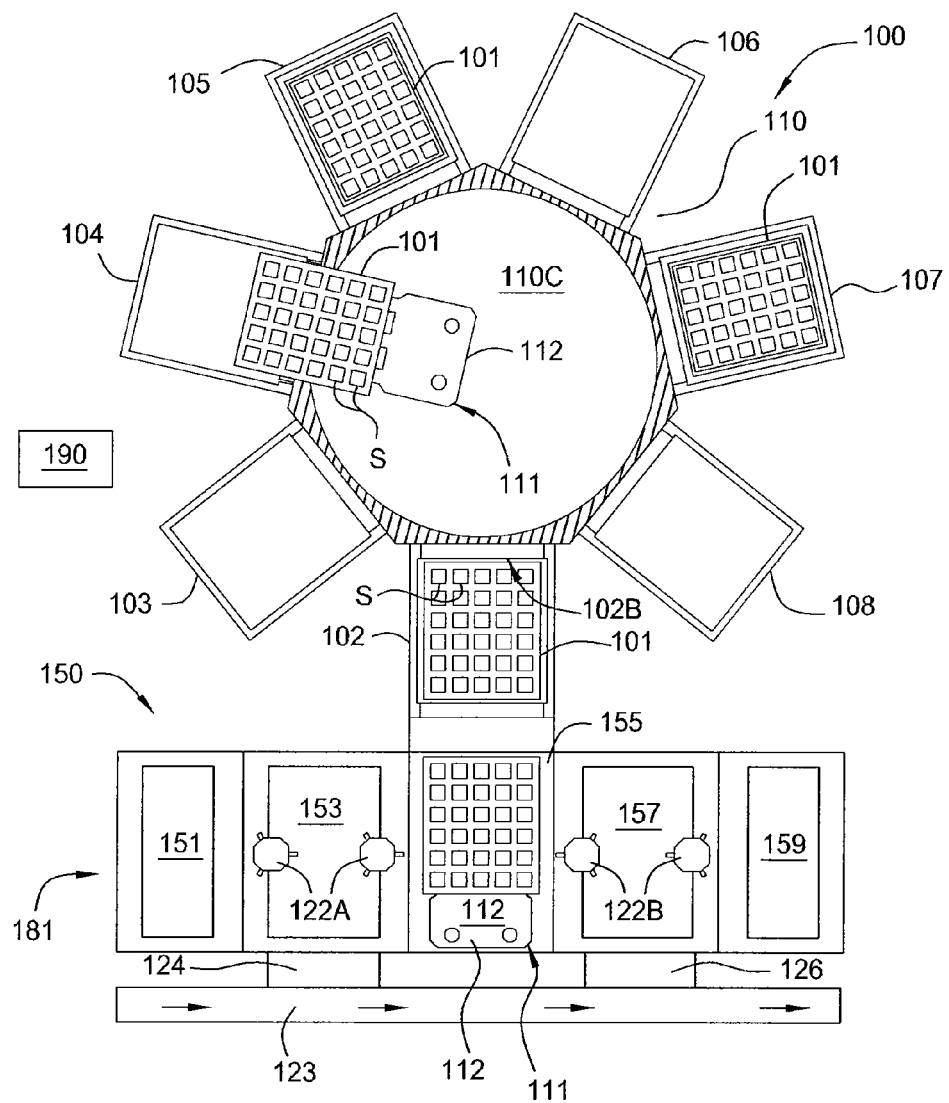
FIG. 5 is a schematic plan view of a substrate processing system according to one embodiment described herein.

The present invention generally provides a batch substrate processing system, or cluster tool, for in-situ processing of a film stack used to form regions of a solar cell device. In one configuration, a film stack formed on each of the substrates in the batch contains one or more passivating or dielectric layers and one or more metal layers that are deposited and further processed within various processing chambers contained in the processing system. The processing chambers may be, for example, physical vapor deposition (PVD) or sputtering chambers, plasma enhanced chemical vapor deposition (PECVD) chambers, low pressure chemical vapor deposition (LPCVD) chambers, hot wire chemical vapor deposition (HWCVD) chambers, ion implant/doping chambers, plasma nitridation chambers, atomic layer deposition (ALD) chambers, plasma or vapor chemical etching chambers, laser anneal chambers, rapid thermal oxidation (RTO) chambers, rapid thermal nitridation (RTN) chambers, rapid thermal annealing (RTA) chambers, substrate reorientation chambers (e.g., flipping chambers (FIGS. 11-13)), vapor etching chambers, forming gas or hydrogen annealers, plasma cleaning chambers, and/or other similar processing chambers.

The substrate processing system may include one or more deposition chambers in which a batch of substrates is exposed to one or more gas-phase materials or RF plasma. In one embodiment, the processing system includes at least one plasma enhanced chemical vapor deposition (PECVD) process chamber that has been adapted to simultaneously process a plurality of substrates. In one embodiment, a batch of solar cell substrates is simultaneously transferred in a vacuum or inert environment to prevent substrate contamination and improve substrate throughput. In the various embodiments of the present invention, each batch of substrates is arranged in a planar array for processing as opposed to processing vertical stacks of substrates (e.g., batches of substrates stacked in cassettes). Such processing of batches of substrates arranged in planar arrays allows each of the substrates in the batch to be directly and uniformly exposed to the generated plasma, radiant heat, and/or processing gases so that each substrate in the planar array is similarly processed in the processing region of a processing chamber. Thus, processing batches of substrates in planar arrays does not rely on diffusion type processes or the serial transfer of energy to all substrates, such as in conventionally configured vertical stack or back-to-back batch processing.

FIGS. 1 and 5-7 illustrate various embodiments of the substrate processing system 100 for performing one or more solar cell fabrication processes on a planar array, or batch, of substrates according to the present invention. One suitable processing system that may be adapted to perform one or more of the processes discussed herein may include a processing platform, such as a Gen. 5, Gen. 6, or Gen. 8 processing platform, available from Applied Materials, Inc., located in Santa Clara, Calif.

In one embodiment, the substrate processing system 100 typically includes a transfer chamber 110 that is coupled to a substrate transport interface 150 via a load lock chamber 102. In certain embodiments, the substrate processing system 100 has a single transfer chamber 110 connected to multiple processing chambers and one or more substrate transport interfaces. In other embodiments, the substrate processing system 100 has a multiple transfer chamber configuration, such as transfer chambers 110A and 110B shown in FIG. 7, that are used to connect multiple processing chambers and substrate transport interfaces. Each transfer chamber 110, 110A, or 110B generally contains a robot 111 that is adapted to transfer substrates among a plurality of processing chambers (e.g., reference numerals 103-108) and load lock chambers (e.g., reference numerals 102). Examples of robots that may be adapted for use in the processing system 100 are disclosed in commonly owned U.S. application Ser. No. 12/247,135 filed on Oct. 7, 2008 by Kurita et al. and U.S. Pat. No. 6,847,730 issued on Jan. 25, 2005 to Beer et al., both of which are incorporated by reference in their entireties herein to the extent not inconsistent with the present disclosure.

In one embodiment, the processing chambers 103-108 are selectively sealably coupled to a transferring region 110C of the transfer chamber 110 by use of a slit valve (not shown). Each slit valve is configured to selectively isolate the processing region in each of the processing chambers 103-108 from the transferring region 110C and is disposed adjacent to the interface between the processing chambers 103-108 and the transfer chamber 110. In one embodiment, the transfer chamber 110 is maintained at a vacuum condition to eliminate or minimize pressure differences between the transfer chamber 110 and the individual processing chambers 103-108, which are typically used to process the substrates under a vacuum condition. In an alternate embodiment, the transfer chamber 110 and the individual processing chambers 103-108 are used to process the substrates in a clean and inert atmospheric pressure environment.

Figure 6:
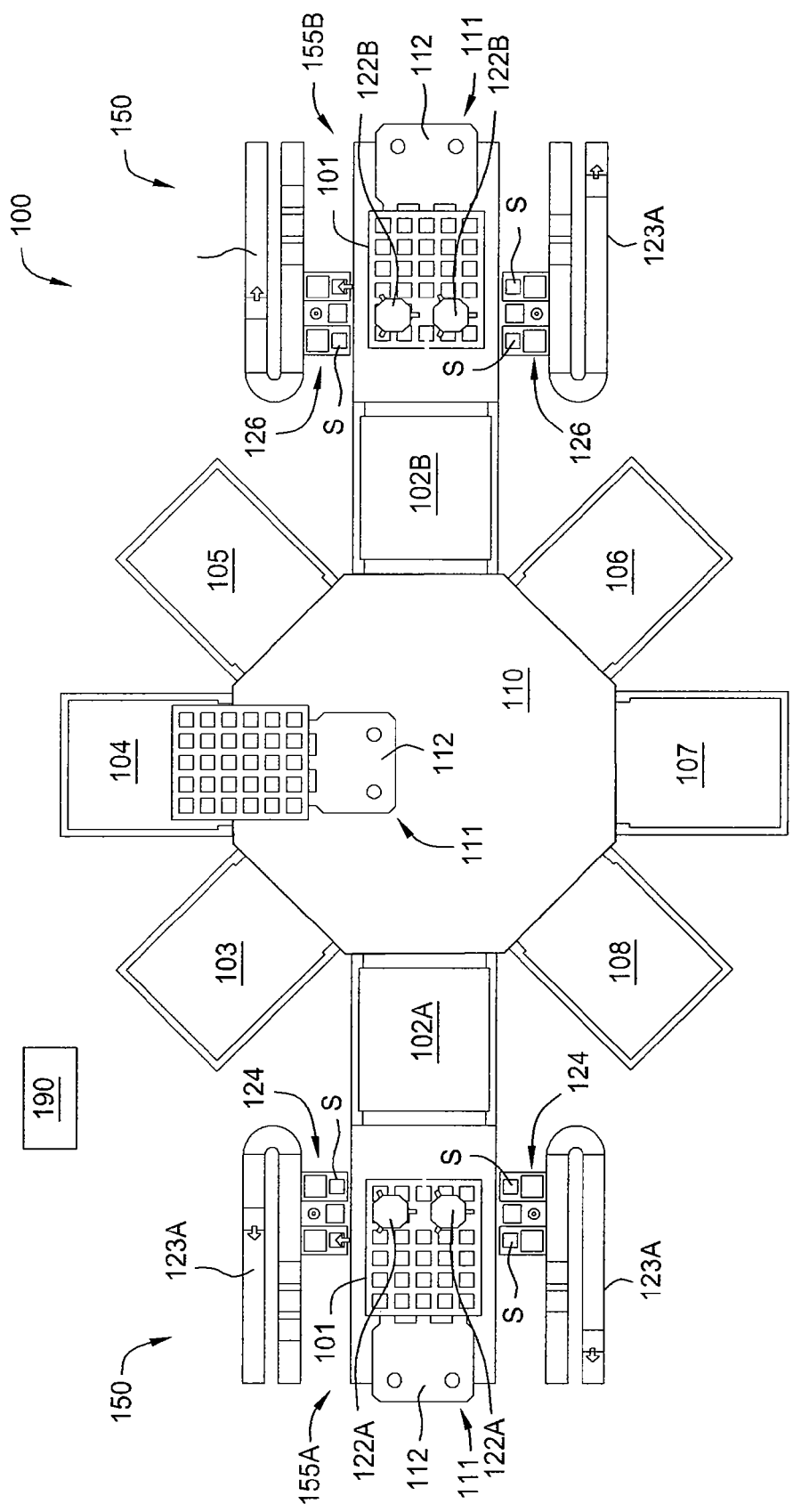
FIG. 6 is a schematic plan view of a substrate processing system according to another embodiment described herein.
Figure 7:
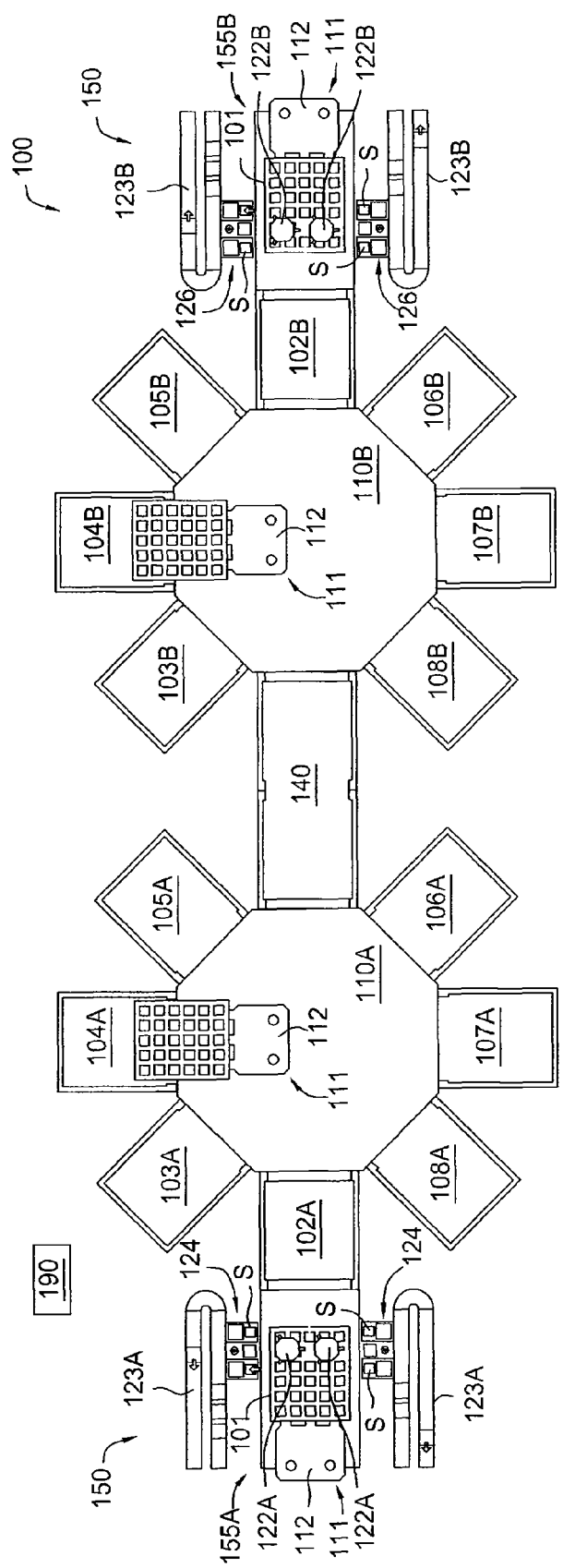
FIG. 7 is a schematic plan view of a substrate processing system according to another embodiment described herein.

It should be noted that the number and orientation of processing chambers (e.g., reference numerals 103-108) shown in the attached figures is not intended to limit the scope of the invention, since these configurational details can be adjusted without deviating from the basic scope of the invention described herein. For instance, FIGS. 1 and 5 show a seven chamber configuration, while FIGS. 6 and 7 show an eight chamber configuration. Other embodiments of the invention may include a configuration with fewer or more chambers depending on the specific processing to be performed on a specific batch size of substrates without deviating from the scope of the present invention.

Generally, the substrate processing system 100 includes a system controller 190 configured to control the automated aspects of the system. The system controller 190 facilitates the control and automation of the overall substrate processing system 100 and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 190 determines which tasks are performable on a substrate. Preferably, the program is software readable by the system controller 190, which includes code to generate and store at least substrate positional information, the sequence of movement of the various controlled components, and any combination thereof.

FIG. 1 is schematic plan view of one embodiment of a substrate processing system 100 that includes six processing chambers (e.g., reference numerals 103-108), a load lock chamber 102, and a robot 111 disposed within the transferring region 110C of the transfer chamber 110. In one configuration, the processing chambers 103-108 are selected from a physical vapor deposition (PVD) chamber, a plasma enhanced chemical vapor deposition (PECVD) chamber, a low pressure chemical vapor deposition (LPCVD) chamber, a hot wire chemical vapor deposition (HWCVD) chamber, a plasma nitridation chamber (DPN), a ion implant/doping chamber, an atomic layer deposition (ALD) chamber, a plasma etching chamber, a laser anneal chamber, a rapid thermal oxidation/nitridation (RTO/N) chamber, a rapid thermal annealing (RTA) chamber, a substrate reorientation chamber (e.g., flipping chamber (FIGS. 11-13)), a vapor etching chamber, a forming gas or hydrogen annealing chamber, and/or a plasma cleaning chamber. According to one embodiment of the invention, the substrate processing system 100 includes a first process chamber 103 and a second process chamber 108 (e.g., FIGS. 1 and 5-7). In one embodiment, the first process chamber 103 is configured to deposit a specific type of film, and the second process chamber 108 is configured to form a different type of film(s) on a substrate surface. For example, the first process chamber 103 can be used to process one or more silicon-containing films and the second process chamber 108 can be used to process one or more metal-containing films to form a high quality solar cell junction. An example of an exemplary PECVD type processing chamber that may be one or more of the processing chambers 103-108 as well as exemplary processes that may be performed are illustrated and subsequently discussed in conjunction with FIG. 13.

FIGS. 1 and 5-7 illustrate embodiments of the substrate processing system 100 that are adapted to transfer and process a plurality of solar cell substrates, hereafter substrates "S" arranged in planar arrays, or batches, within the processing system 100. In one embodiment, each substrate transport interface 150 as well as each transfer chamber 110, 110A, or 110B may include a transfer robot 111 having an end effector 112 to facilitate transfer of a batch of substrates S through the processing system 100 as described herein. In one embodiment, the processing system 100 is adapted to transfer and process a batch of substrates S that are positioned in a planar array on a carrier 101. In one embodiment, the carrier 101 is adapted to hold and retain the substrates S during the various transportation and processing steps performed on the substrates S within the processing system 100. In this configuration multiple substrates S are transferred, supported, and processed simultaneously to improve the system throughput, reduce the number of required transferring steps, and improve the cost of ownership associated with processing and forming a solar cell device.

FIG. 2 illustrates a plan view of one embodiment of the carrier 101 that is adapted to retain 30 substrates S on the carrier 101. In one configuration, the carrier 101 has a plurality of substrate supporting recesses 101A formed in the carrier 101 to support and laterally retain the substrates S during the movement of the carrier 101 through the substrate processing system 100. In one embodiment, the carrier 101 is adapted to hold at least about 10 substrates S at a time in a planar array. In one embodiment, the carrier 101 is adapted to hold between about 30 and about 49 substrates S at a time in a planar array. In one embodiment, the carrier 101 is adapted to hold greater than 49 substrates S at a time in a planar array. In one configuration the recesses 101A formed in the surface of the carrier 101 have lateral dimensions that are less than about 1 mm larger than the dimensions of the substrate S and have a depth that is greater than the thickness of the substrate S. For example, a solar cell substrate S may have dimensions 156 mm×156 mm×0.2 mm, and the recesses 101A may have corresponding dimensions 158 mm×158 mm×0.3 mm. In another embodiment, the carrier 101 may be a flat carrier without recesses. The carrier 101 may include pins or bosses extending therefrom to retain the substrates S thereon.

In other embodiments, the processing system 100 is configured to transfer and process a batch of substrates S that are arranged in a planar array without the use of the carrier 101 to support and retain the substrates S. These embodiments provide certain benefits, including reduction in cost, elimination of the need to clean and maintain carriers, and elimination of issues associated with carrier material compatibility (i.e., carrier material that is mutually compatible with the process conditions in all process chambers).

FIG. 3 is a schematic plan view of an end effector 112 for use in transferring a batch of substrates S in the processing system 100 without a substrate carrier 101 according to one embodiment of the present invention. In one embodiment, the end effector 112 includes a plurality of support arms 113 with support features 113A that are adapted to retain the substrates S as they are being transferred through the processing system 100. Each support feature 113A includes capturing elements (not shown), such as machined recesses or pockets, that are configured to retain and prevent each substrate S from sliding out of position during transfer.

FIG. 4 is a schematic plan view of the end effector 112 for use in transferring a batch of substrate S in the processing system 100 without a substrate carrier 101 according to another embodiment of the present invention. In one embodiment, the end effector 112 includes a plurality of substrate conveyors 116 that are used to support and transfer a batch of substrates S through the processing system 100. The substrate conveyors 116 may include belts and/or rollers that are moved by one or more actuators (not shown) included in the end effector 112. As subsequently described, corresponding substrate conveyors 116 may be included within the load lock chambers 102 and/or processing chambers 103-108 as well, in order to facilitate the simultaneous movement and transfer of each substrate S in the batch.

Referring to FIGS. 1 and 5, the processing system 100 may be configured to receive unprocessed substrates S into the substrate transport interface 150 from a downstream location (e.g., a downstream processing module in a solar cell fabrication line) and transport processed substrates S out of the substrate transport interface 150 to an upstream location (e.g., an upstream processing module in a solar cell fabrication line). In general, the substrate transport interface 150 depicted in FIGS. 1 and 5 includes a first carrier buffer module 151, a substrate loading module 153, a substrate interface module 155, a substrate unloading module 157, and a second carrier buffer module 159. Transfer of the substrate carriers 101 between modules of the substrate transport interface 150 may be accomplished via an automated conveying system 181. Although the processing system 100 depicted in FIGS. 1 and 5 are described as processing a batch of substrates S on a substrate carrier 101 (e.g., FIG. 2), this is not meant to limit the scope of the invention as "carrierless" embodiments (e.g., FIGS. 3 and 4) are also applicable to the configuration of the processing system 100 depicted in FIGS. 1 and 5.

In operation, an empty substrate carrier 101 may be stored or received in the first carrier buffer module 151. The empty substrate carrier 101 may then be moved into the substrate loading module 153 where it awaits loading of the substrates S into the substrate recesses 101A. In one embodiment, the substrates S are transported to the substrate transport interface 150 via one or more modular conveyors 123.

In the embodiment depicted in FIG. 1, a modular conveyor 123A is positioned on each side of the substrate transport interface 150 for transporting unprocessed substrates S to the substrate loading module 153 from a downstream location. Additionally, a modular conveyor 123B is positioned on each side of the substrate transport interface 150 for receiving processed substrates S from the substrate unloading module 157 for transportation to an upstream location. In the embodiment depicted in FIG. 5, a single modular conveyor 123 is positioned to transport unprocessed substrates S for loading into the substrate loading module 153 and to receive processed substrates S from the unloading module 157 for transportation to an upstream location.

The substrates S may be transported on the modular conveyors 123 individually or in batches, such as in cassettes or stack boxes. In one embodiment, the substrates S are removed from the modular conveyor 123 or 123A and transferred into a receiving area 124 in preparation for loading the substrates S onto a carrier 101 positioned in the substrate loading module 153. In one embodiment, the substrate loading module 153 includes robots 122A for transferring the substrates S from the receiving area 124 into a desired position on the substrate carrier 101. In one embodiment, the robots 122A may be SCARA, six-axis, parallel, or linear type robots that can be adapted to transfer substrates from one position within the processing system 100 to another. In one example, the robots 122A are Quattro Parallel Robots that are available from Adept Technology, Inc. of Pleasanton, Calif.

In another embodiment, the substrates S may be loaded directly onto positions on the automated conveying system 181 for transport into the substrate interface module 155. In the case of stack boxes or cassettes, once the substrates S are unloaded from the respect stack box or cassette, the empty stack box or cassette is returned to the modular conveyor 123 or 123A for transport either back downstream (FIG. 1) or upstream (FIG. 5) for further use.

In one embodiment, after filling up the carrier 101 with substrates S, the carrier 101 is transferred into the substrate interface module 155. In one embodiment, the substrate interface module 155 includes a robot 111 having an end effector 112 configured to receive the substrate carrier 101 from the substrate loading module 153 and transfer the substrate carrier 101 into the load lock chamber 102.

In another embodiment, the substrates S are transferred directly onto the end effector 112 (FIG. 3 or 4) from the automated conveying system 181. It should be noted that not all regions of the carrier 101 or end effector 112 need to be filled during processing. For example, a substrate S may have been broken in an earlier process. In some cases, a partial batch of substrates S may be intentionally processed within the processing system 100. In some cases, when a partial batch of substrates S are to be processed, it may be desirable to insert one or more dummy substrates within a batch of substrates S to minimize the exposure of the chamber components (e.g., susceptor) directly to the processing environment.

Figure 11:
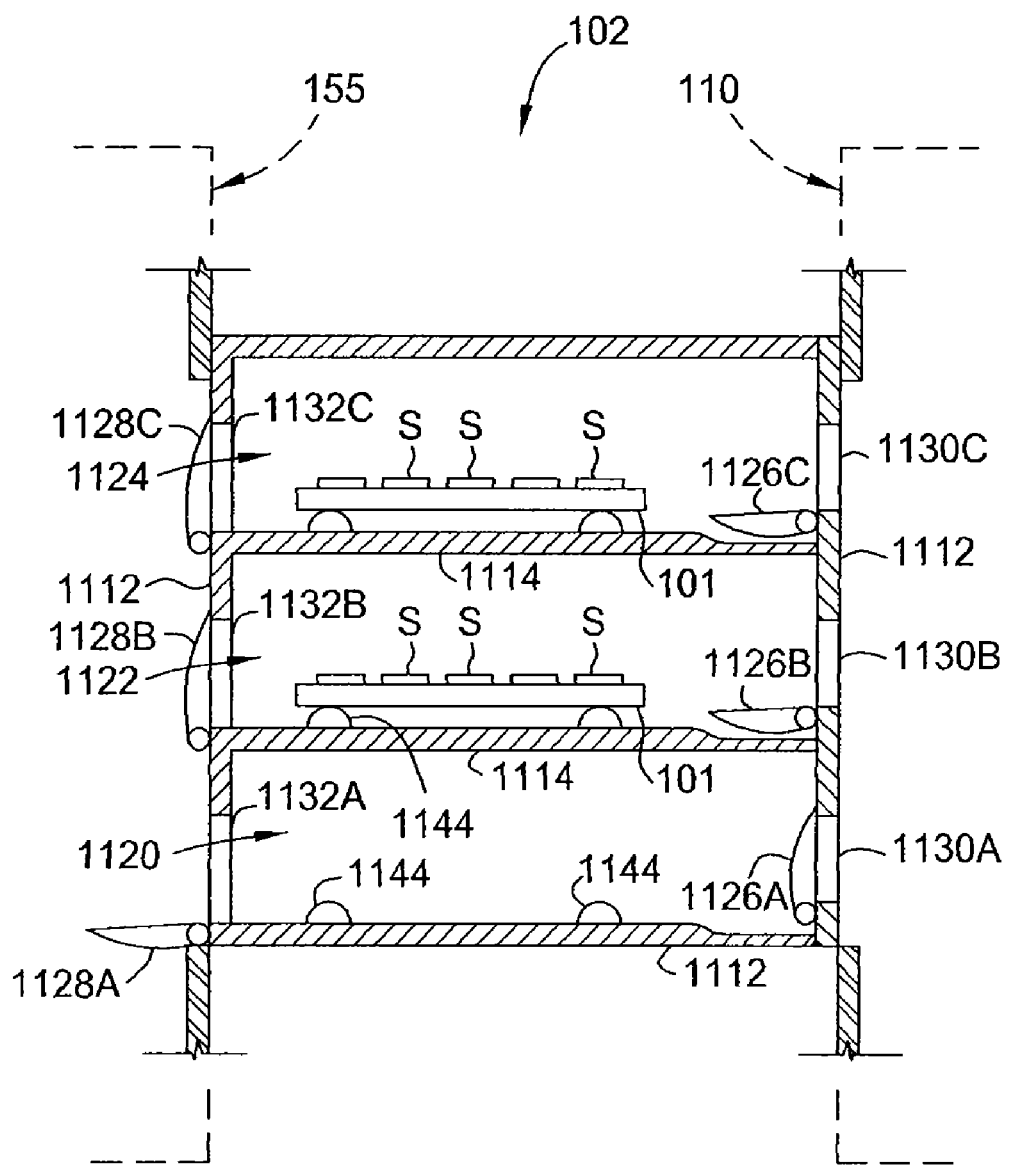
FIG. 11 is a schematic cross-sectional view of a load lock chamber according to one embodiment described herein.

In one example, the load lock chamber 102 comprises a plurality of isolatable regions (e.g., substrate sub-chambers 1120, 1122, 1124 illustrated in FIG. 11) that allow the unimpeded movement of multiple substrate carriers 101 and/or substrates S into and out-of the load lock chamber 102 from the transfer chamber 110 or the substrate interface module 155. An example of an exemplary load lock chamber 102 having a plurality of isolatable regions is illustrated and discussed in conjunction with FIG. 11 shown below.

In an embodiment wherein the processing system 100 does not use substrate carriers 101, the load lock chamber 102 and processing chambers 103-108 are configured to receive and support each of the individual substrates S in the batch. In this configuration, the substrates S are supported and/or retained on substrate supporting devices (e.g., pockets 1222 in FIG. 12) contained within the load lock chamber 102 and processing chambers 103-108. In one embodiment, the substrate supporting devices may also contain lift assembly components that are used to individually remove the substrates S from the end effector 112 so that the end effector can be removed from the processing chamber before the substrates S are placed on a supporting surface on the substrate supporting device(s). In one embodiment, the substrate supporting devices in the load lock chamber 102 and the processing chambers 103-108 are each a dedicated substrate carrier 101 that remains within each of the chambers to support and retain the substrates S.

After receiving the substrate carrier 101 and/or the substrates S into a region of the load lock chamber 102, such as sub-chamber 1120 (FIG. 11), the sub-chamber 1120 is closed and pumped down to a desired pressure using a vacuum pump (not shown). After achieving a desired pressure in the sub-chamber 1120, the substrate carrier 101 and/or the substrates S are then received by the end effector 112 of the transfer robot 111 contained in the transfer chamber 110. The transfer robot 111 may then transfer the substrate carrier 101 and/or the substrates S into one of the processing chambers, such as processing chamber 103. In one example, a PECVD amorphous silicon deposition process is then performed on the substrates S positioned in the processing chamber 103.

In one embodiment, the substrates S are crystalline silicon substrates having p-type base regions. A mixture of gases including silicon-containing compounds, such as silane ($SiH_4$), disilane ($Si_2H_6$), tetrafluorosilane ($SiF_4$), or other silicon-containing compounds useful for depositing a layer of amorphous silicon directly onto a surface of the crystalline silicon substrates S. An n-type precursor, such as phosphine ($PH_3$) is delivered to the processing chamber along with the silicon-containing compounds in order to provide an n-doped amorphous silicon film layer deposited on the substrates S from the gas mixture. In one embodiment, the doped amorphous silicon film is deposited at a film thickness from about 100' to about 1000'.

After performing a desired solar cell formation process on the substrates S, the substrate carrier 101 and/or the substrates S are then transferred by the transfer robot 111 into another processing chamber, such as the processing chamber 104. In one example, a passivation layer deposition process is performed on the substrates S positioned in the processing chamber 104. Examples of such a passivation layer process is subsequently described below in the section entitled, "Passivation Layer Deposition."

In one embodiment, the processing system 100 may further include a processing chamber for reorienting, or flipping, the substrates S (i.e., FIGS. 8-10), such as the processing chamber 105. In such an embodiment, the substrates S, having been processed on one side, may then be transferred into the processing chamber 105 for reorienting the substrates S such that the opposite side may be processed. For instance, if an upwardly facing side of each substrate is first processed, the processing chamber 105 reorients each of the substrates S such that the previously upwardly facing side faces downwardly and the previously downwardly facing side faces upwardly for subsequent processing. After reorienting the substrates S, the substrates S may then be transferred into subsequent processing chambers, such as processing chambers 106, 107, or 108 for processing the opposite side of the substrates S prior to transfer back into the load lock chamber 102. In one embodiment, the substrates S are transferred into processing chamber 106, such as a PVD chamber, and a metallization type deposition process is performed on the substrates S. Thus, processing of a first side of the substrates S, flipping of the substrates S, and processing of the opposite side of the substrates S may all be achieved within the processing system 100 without breaking vacuum within the system. In one embodiment, a metallization type deposition process is performed on the substrates S.

After performing desired solar cell formation processes on the substrates S, the substrate carrier 101 and/or the substrates S are then transferred by the transfer robot 111 from the transfer chamber 110 to a region of the load lock chamber 102, such as sub-chamber 1122 (FIG. 11). After achieving a desired pressure in the sub-chamber 1122, the substrate carrier 101 and/or the substrates S are then retrieved from the load lock chamber 102 by the transfer robot 111 from the substrate interface module 155. Once the substrates S are transferred back into the substrate interface module 155, the substrate carrier 101 and/or the substrates S are transported into the substrate unloading module 157 via the automated conveying system 181 for unloading the individual substrates S from the substrate transfer interface 150. In one embodiment, each of the substrates S are then transferred from the substrate unloading module 157 to the substrate exit area 126 via robots 122B contained in the substrate unloading module 157. After the substrates S are positioned in the exit area 126, the empty substrate carrier 101 may be transferred into the second carrier buffer module 159 via the automated conveying system 181. From there, the substrate carrier 101 may be stored, removed and cleaned, and/or transported back to the first carrier buffer module 151.

After positioning the substrates S in the exit area 126, the substrates S are then transferred to the modular conveyor 123 or 123B where the processed substrates S are transported to upstream process modules in the solar cell fabrication facility. This configuration may be used to allow both sides of a solar cell substrate to be processed in a vacuum or inert environment without exposure to atmospheric contaminants.

It should be noted that the number of transferring steps and processing steps discussed herein are not intended to limit the scope of the invention and can vary in the number of processes performed on the solar cell substrate S, vary in the number of processing chambers that are used to from a solar cell, and vary in the order and sequence of processes without deviating from the basic scope of the invention disclosed herein.

FIGS. 6 and 7 depict embodiments of the substrate processing system 100 having substrate transport interfaces 150 with a single module for receiving the substrates S directly onto the end effector 112. In one embodiment, the processing system 100 illustrated in FIGS. 6 and 7 is configured to process and transfer batches of substrates S using a carrier 101, as illustrated in FIG. 2, or as a carrier-less type configuration, as illustrated in FIGS. 3 and 4.

FIG. 6 is a schematic plan view of one embodiment of the processing system 100 having an input substrate interface module 155A and an output substrate interface module 155B that are each coupled to a single transfer chamber 110. In one embodiment, a modular conveyor 123A is positioned on each side of the input substrate interface module 155A for transporting unprocessed substrates S to the input substrate interface module 155A from a downstream location. Additionally, a modular conveyor 123B is positioned on each side of the output substrate interface module 155B for receiving processed substrates S from the output substrate interface module 155B for transportation to an upstream location.

The substrates S may be transported on the modular conveyors 123A individually or in batches, such as in cassettes or stack boxes. In one embodiment, the substrates S are removed from the modular conveyors 123A and transferred into receiving areas 124 in preparation for loading the substrates S into the input substrate interface module 155A. In one embodiment, the substrate interface module 155A includes robots 122A for transferring the substrates S from the receiving area 124 into a desired position within the input substrate interface module 155A. In one embodiment, the substrates S are each placed in desired locations on a substrate carrier 101 (FIG. 2) positioned on the end effector 112 of the robot 111 positioned within the input substrate interface module 155A. In another embodiment, the substrates S are each placed in desired locations on the end effector 112 as shown and described with respect to FIG. 3 or 4. In the case of stack boxes or cassettes, the empty stack box or cassette is returned to the modular conveyors 123A for transport back downstream for further use.

In one embodiment, after filling up the carrier 101 or end effector 112 with substrates S, the batch of substrates S is transferred into a load lock chamber 102A. It should be noted that not all regions of the carrier 101 or end effector 112 need to be filled during processing. For example, a substrate S may have been broken in an earlier process. In some cases, a partial batch of substrates S may be intentionally processed within the processing system 100. In some cases, when a partial batch of substrates S are to be processed, it may be desirable to insert one or more dummy substrates within a batch of substrates S to minimize the exposure of the chamber components (e.g., susceptor) directly to the processing environment.

After receiving the substrates S into a region of the load lock chamber 102A, such as sub-chamber 1120 (FIG. 11), the sub-chamber 1120 is closed and pumped down to a desired pressure using a vacuum pump (not shown). After achieving a desired pressure in the sub-chamber 1120, the substrates S are then received by the end effector 112 of the transfer robot 111 contained in the transfer chamber 110. The transfer robot 111 may then transfer the substrates S into one or more of the processing chambers 103 or 104 for processing on a first side of each of the substrates S.

In one embodiment, the processing system 100 may further include a processing chamber for reorienting, or flipping, the substrates S (i.e., FIGS. 8-10), such as the processing chamber 105. In such an embodiment, the substrates S, having been processed on one side, may then be transferred into the processing chamber 105 for reorienting the substrates S such that the opposite side may be processed. After reorienting the substrates S, the substrates S may then be transferred into subsequent processing chambers, such as processing chambers 106, 107, or 108 for processing the opposite side of the substrates S prior to transfer back into the load lock chamber 102. Thus, processing of a first side of the substrates S, flipping of the substrates S, and processing of the opposite side of the substrates S may all be achieved within the processing system 100 without breaking vacuum within the system.

After performing the desired solar cell formation processes on the substrates S, they are transferred by the transfer robot 111 form the transfer chamber 110 to a region of the load lock chamber 102B, such as sub-chamber 1122 (FIG. 11). After achieving a desired pressure in the sub-chamber 1122, the substrates S are retrieved from the load lock chamber 102 by a transfer robot 111 located in the output substrate interface module 155B. In one embodiment, each of the substrates S are then transferred from the output substrate interface module 155B to the substrate exit area 126 via robots 122B located in the output substrate interface module 155B.

After positioning the substrates S in the exit area 126, the substrates S are then transferred to the modular conveyors 123B, where the processed substrates S are transported to upstream process modules in the solar cell fabrication facility. This configuration can be used to minimize the bottlenecks or other undesirable processing constraints that can occur when using a single load lock chamber 102 that is the entry and exit path for the batches of substrates S and/or allow both sides of a solar cell substrate to be processed in a vacuum or inert environment without exposure to atmospheric contaminants.

FIG. 7 is a schematic plan view of one embodiment of the processing system 100 having an input substrate interface module 155A and an output substrate interface module 155B, joined by two transfer chambers 110A and 110B. In one embodiment, the processing system 100, illustrated in FIG. 7, is configured to process and transfer batches of substrates S in a planar array using a carrier 101 type configuration, as illustrated in FIG. 2. In another embodiment, the processing system 100 is configured to process and transfer batches of substrates S in a carrier-less type configuration, as illustrated in FIGS. 3 and 4.

In one embodiment, the processing system 100, depicted in FIG. 7, has an input substrate loading module 155A that is coupled to a first transfer chamber 110A, an output substrate loading module 155B that is coupled to a second transfer chamber 110B, and a pass-through module 140 that is sealably coupled to the first transfer chamber 110A and the second transfer chamber 110B. In one embodiment, the pass-through module 140 is a simple load lock chamber (e.g., reference 102 in FIG. 11) that acts as a pass-through between the two transfer chambers 110A and 110B.

In another embodiment, the pass-through module 140 contains one or more substrate flipping devices that are able to re-orient the substrates S before they are transferred between the two transfer chambers 110A and 110B. In this case, the pass-through module 140 is used to flip the substrates S so that one side of each of the substrates S can be processed in one part of the processing system 100, such as processing chambers 103A-108A, and the other side of each of the substrates S can be processed in another part of the processing system 100, such as processing chambers 103B-108B. An example of some typical flipping devices are illustrated and discussed below in conjunction with FIGS. 8, 9, and 10A-10C.

Referring to FIG. 7, the substrates S are generally received from the modular conveyors 123A and transferred into the receiving areas 124 in preparation for loading the substrates S into the input substrate interface module 155A. As with other embodiments of the invention, the substrates S may be transported on the modular conveyors 123A individually or in batches, such as in cassettes or stack boxes. In one embodiment, the substrates S are loaded into the input substrate interface module 155A via robots 122A that are contained in the input interface module 155A. In one embodiment, the substrates S are each placed in desired locations on a substrate carrier 101 (FIG. 2) positioned on the end effector 112 of the robot 111 positioned within the input substrate interface module 155A. In another embodiment, the substrate S are each placed in desired locations on the end effector 112, as shown and described with respect to FIG. 3 or 4. In the case of stack boxes or cassettes, the empty stack box or cassette is returned to the modular conveyors 123A for transport back downstream for further use.

The substrates S are then transferred into the load lock chamber 102A using the robot 111, and the load lock chamber is pumped down to a desired pressure using a vacuum pump (not shown). The substrates S are then transferred to one or more of the processing chambers 103A-108A for processing. Next, after processing, the substrates S are then positioned within the pass-through module 140 using the robot 111A contained in transfer chamber 110A. In one embodiment, the batch of substrates S are flipped in the pass-though module 140. Then, the substrates S are transferred to one or more of the processing chambers 103B-108B for processing. Thus, processing of a first side of the substrates S, flipping of the substrates S, and processing of the opposite side of the substrates S may all be achieved within the processing system 100 without breaking vacuum within the system. The substrates S are then positioned within the load lock chamber 102B using the robot 111B contained in transfer chamber 110B, and then transferred, positioned, and removed from the processing system 100 using the robots 122B found in the output substrate interface module 155B. In one embodiment, it may be desirable to re-orient the substrates S so that they exit the processing system 100 in the same orientation as they were received. This configuration can be used to minimize the bottlenecks, increase the number of processing chambers that can be used to form a solar cell device, and/or allow both sides of a solar cell substrate to be processed in a vacuum or inert environment without exposure to atmospheric contaminants.

Batch Substrate Flipping Mechanisms

Figure 8:
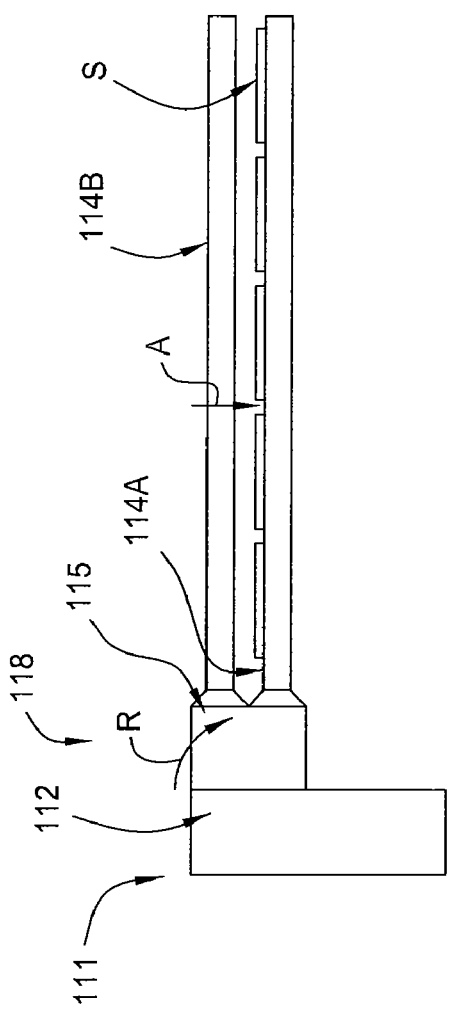
FIG. 8 is a schematic side view of a flipping device according to one embodiment described herein.

FIGS. 8, 9, and 10A-10C illustrate various examples of flipping devices that may be positioned in one or more of the processing chambers 103-108, load lock chambers 102, transfer chambers 110, or pass-through modules 140 to reorient or flip the solar cell substrates S so that processing can be easily performed on both sides of the substrates S. FIG. 8 is a side view of one embodiment of flipping device 118 that is used to flip a batch of substrates S all at once using a rotation actuator 115. In one embodiment, the flipping device 118 has supporting arms 114A and 114B that are adapted to receive and support a plurality of substrates S. In one embodiment, the supporting arms 114A and 114B comprise a plurality of supporting features 113A that are adapted to support the substrates S. While the configuration illustrated in FIG. 8 is shown as part of the robot 111 this configuration is not intended to limit the scope of the invention described herein.

As shown in FIG. 8, the flipping sequence generally entails bringing the supporting arms 114A and 114B in close proximity following path "A" using a linear actuator (e.g., linear servo motor) contained in the flipping device 118, then rotating the supporting arms 114A and 114B about an rotational axis following path "R" using a rotational actuator 115, such as a servo motor or other similar device, so that the substrates S are transferred from the supporting arms 114A to the supporting arms 114B. After reorienting the substrates S so that they are positioned on the supporting arms 114B the supporting arms 114A and 114B are moved apart so that the substrates S positioned on the supporting arms 114B can be transferred to a desired transferring device or position within the processing system 100.

Figure 9:
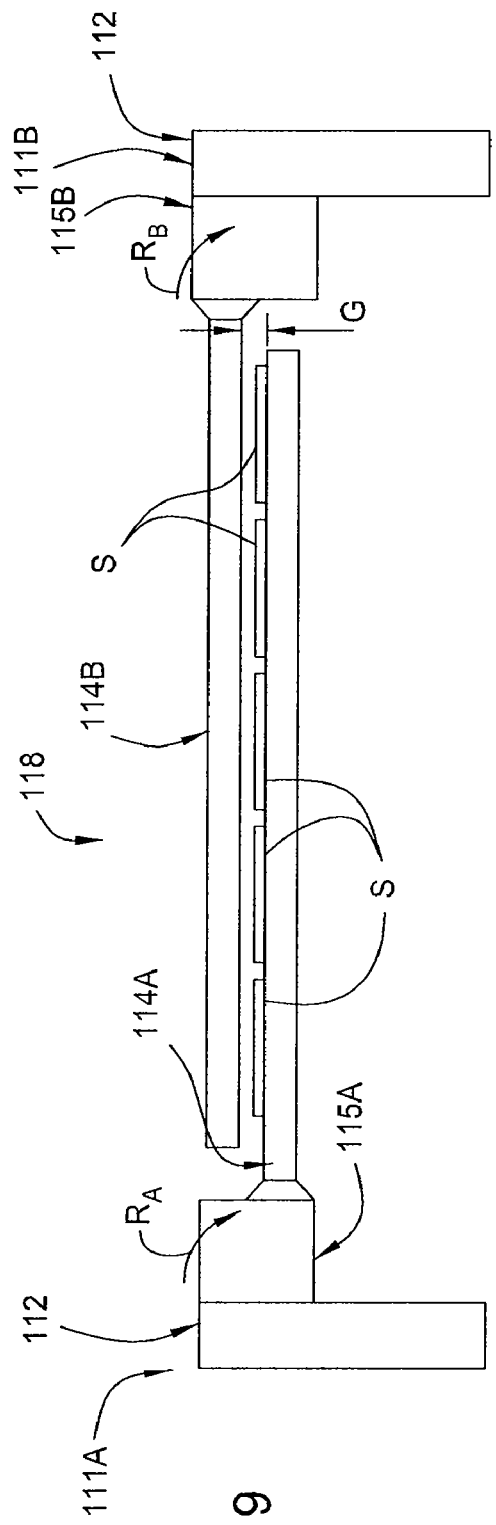
FIG. 9 is a side view of a flipping device according to another embodiment described herein.

FIG. 9 is a side view of one embodiment of flipping device 118 that uses two separate robotic devices to flip a batch of substrates S all at once using synchronized rotational motion of each of the supporting arms 114A and 114B, which are rotated by the coupled rotation actuators 115A and 115B (e.g., servo motor), respectively. Referring to FIG. 9, in one embodiment, the flipping device 118 comprises using two robotic devices, such as the robot 111A contained in the transfer chamber 110A and the robot 111B contained in the transfer chamber 110B, which are brought together in the pass-through module 140 to perform the flipping process.

As shown in FIG. 9, the flipping sequence generally entails bringing the supporting arms 114A and 114B in close proximity, then simultaneously rotating the supporting arms 114A and 114B about their respective rotational axes following paths "$R_A$" and "$R_B$" so that the substrates S are transferred from supporting arms 114A to supporting arms 114B. In general, it is desirable to position the rotational axes of the rotational actuators 115A and 115B in line with each other (not shown) so that the gap "G" formed between the supporting arms 114A and 114B does not vary as the substrates S are flipped.

In the embodiments shown and described with respect to FIG. 9, an entire batch of substrates S may be flipped simultaneously. In one embodiment the batch is flipped while maintaining the substrates S in a planar array throughout the flipping process. For instance, the entire array (i.e., rows and columns) of substrates S are maintained in plane as they are flipped about a single axis. In this embodiment, carriers 101 may be used during the flipping process. For example, one carrier 101 may be positioned atop another carrier 101 such that the substrates S are transferred from one carrier 101 to another carrier 101 during the flipping process. In another embodiment, the substrates S are flipped in either individual rows or columns instead of maintaining the entire array (i.e., rows and columns) in plane during the flip. In this embodiment, multiple pairs of supporting arms 114A and 114B may each separately flip a row of substrates.

Figure 10A:
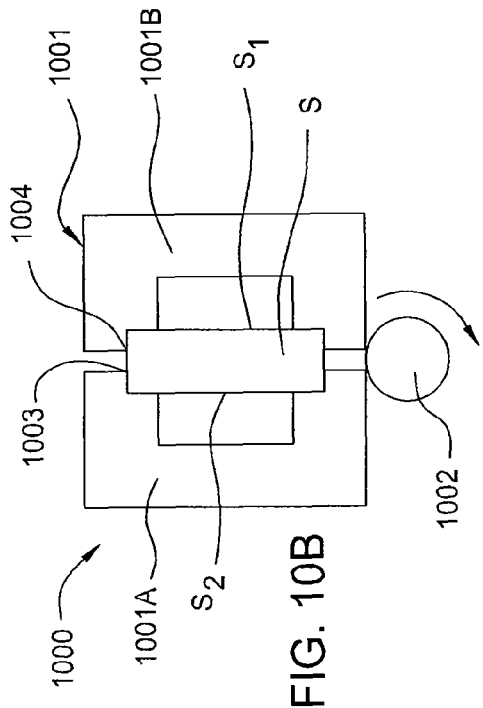
FIGS. 10A-10C are schematic side views of another embodiment of a flipping device according to another embodiment described herein.
Figure 10B:
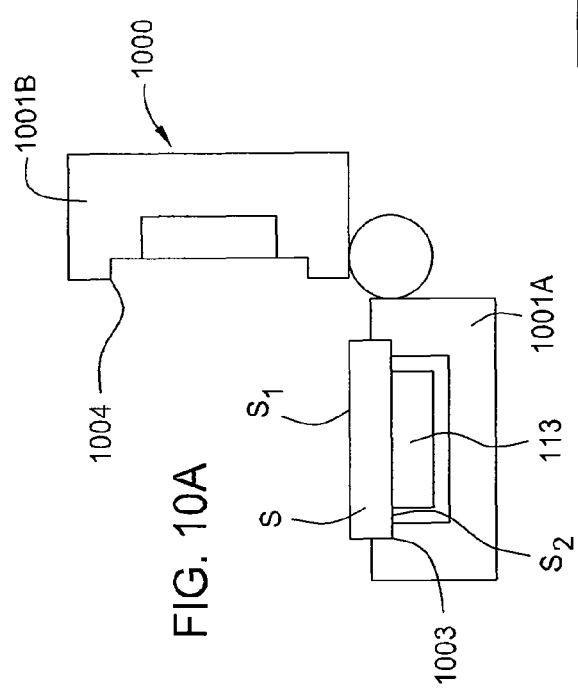
Figure 10C:
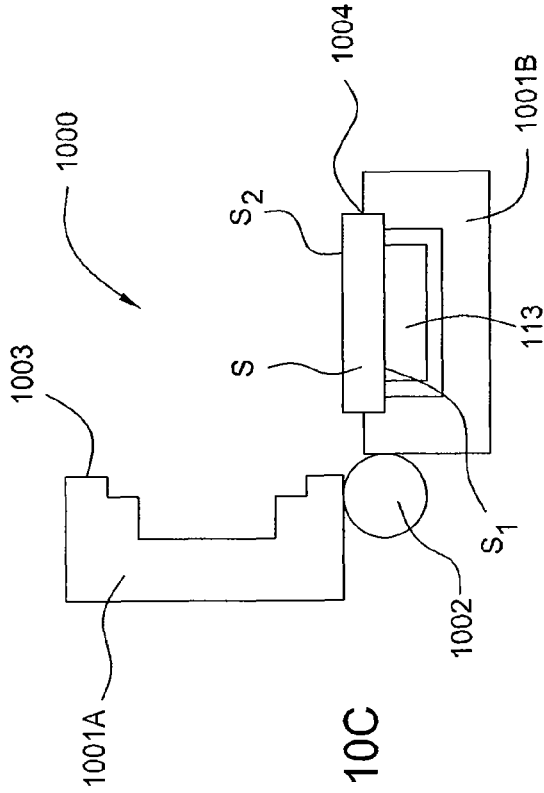

FIGS. 10A-10C are side views that illustrate a flipping device 1000 at different stages of the flipping process. For clarity, only a single flipping device 1000 is shown in FIGS. 10A-10C. In practice, a plurality of flipping devices 1000 are arranged in a planar array to match the arrangement of the batch of substrates S as described herein. FIG. 10A illustrates the flipping device 1000 in a first orientation so that it can receive a plurality of substrates S on a first surface 1003 of a support 1001 from the supporting arms 113 of a robot 111. Once received, the supporting arms 113 of a robot 111 are removed from the flipping device 1000 by movement of the robot 111. Thus, the substrates S are positioned on the first surface 1003. In one embodiment, the support 1001 is divided, or hinged into two sections 1001A and 1001B joined by a rotational actuator 1002 configured to rotate the two sections together or apart as well as to rotate the entire support 1001. In this embodiment, the rotational actuator 1002 first rotates the section 1001A upwardly to bring the first surface 1003 into close proximity with a second surface 1004, as shown in FIG. 10B. Next, the entire support 1001 is rotated about 90 degrees using the rotational actuator 1002. Next, the first surface 1003 is extended away from the second surface 1004 to complete the transfer of the substrate S from the first surface 1003 to the second surface 1004. Then, the supporting arms 113 of the robot 111 may be inserted to remove the flipped substrates S from the second surface 1004, as shown in FIG. 10C. In this configuration, each substrate S is reoriented from a position having a first side $S_1$ in a face-up orientation and a second side $S_2$ in a face-down orientation to a position having the first side $S_1$ in a face-down orientation and the second side $S_2$ in a face-up orientation.

Load Lock Chambers

FIG. 11 is a cross-sectional view of one embodiment of the load lock chamber 102. The load lock chamber 102 may include a plurality of single substrate transfer compartments/sub-chambers as shown in FIG. 11, or alternatively one or more transfer compartments/sub-chambers, each sub-chamber for loading and unloading multiple substrates. Load lock chambers that may be adapted to benefit from the invention are described in commonly assigned U.S. patent application Ser. Nos. 09/663,862 filed on Sep. 15, 2000, by Kurita et al.; 09/957,784, entitled "Double Dual Slot Load Lock for Process Equipment", filed Sep. 21, 2001 by Kurita et al. and issued on Mar. 21, 2002 as U.S. Pat. No. 7,105,463; and Ser. No. 10/832,795, entitled "Load Lock Chamber for Large Area Substrate Processing System", filed Apr. 26, 2004 by Kurita et al. and issued on Apr. 24, 2007 as U.S. Pat. No. 7,207,766, all of which are hereby incorporated by reference in their entireties.

The load lock chamber 102 may include a chamber body 1112 with a plurality of vertically-stacked, environmentally-isolated, single substrate sub-chambers 1120, 1122, 1124 separated by a plurality of vacuum-tight, horizontal interior walls 1114. Two of the interior walls 1114 are shown in FIG. 11. Although three single substrate sub-chambers 1120, 1122, 1124 are shown in the embodiment depicted in FIG. 11, it is contemplated that the chamber body 1112 of the load lock chamber 102 of the invention may include just one load lock chamber or two or more vertically-stacked substrate load lock sub-chambers. For example, the load lock chamber 102 may include N substrate sub-chambers separated by N−1 horizontal interior walls 1114, where N is an integer number.

In the embodiment depicted in FIG. 11, the substrate sub-chambers 1120, 1122, 1124 are each configured to accommodate a single batch of substrates S, such as a plurality of substrates S disposed on the substrate carrier 101 (FIG. 2), so that the volume of each chamber may be minimized to enhance fast pumping and vent cycles. It is contemplated that load lock chambers or sub-chambers of the invention may be configured to accommodate even larger batches of substrates.

The chamber body 1112 can be fabricated from a rigid material suitable for use under vacuum conditions, such as stainless steel or aluminum. The horizontal walls 1114 of the chamber body 1112 may be vacuum sealed to sidewalls of the chamber body 1112, thereby isolating the substrate sub-chambers 1120, 1122, 1124. For example, the horizontal walls 1114 assembled into the load lock chamber 102 may be continuously welded to the chamber body 1112 to allow greater access to the entire interior of the chamber body 1112.

Generally, each of the substrate sub-chambers 1120, 1122, 1124 defined in the chamber body 1112 includes two substrate access ports. For example, in FIG. 11, the first substrate sub-chamber 1120 disposed at the bottom of the chamber body 1112 includes a first substrate access port 1130A and a second substrate access port 1132A coupled to the transfer chamber 110 (FIG. 1) and the substrate interface module 155, respectively. The two access ports may be positioned, for example, on opposite sides of the chamber sidewalls. The substrate access ports are configured to facilitate the entry and egress of the substrates from the load lock chamber 102. Similarly, the substrate sub-chamber 1122 is configured with access ports 1130B, 1132B and the substrate sub-chamber 1124 is similarly configured with access ports 1130C, 1132C. Each of the substrate access ports 1130A, 1130B, 1130C, 1132A, 1132B, 1132C is selectively sealed by a respective slit valve 1126A, 1126B, 1126C, 1128A, 1128B, 1128C that is adapted to selectively isolate the substrate sub-chambers 1120, 1122, 1124 from the environments of the transfer chamber 110 and the substrate interface module 155. The slit valves 1126A, 1126B, 1126C, 1128A, 1128B, 1128C are pivotally coupled to the chamber body 1112 and may be moved between an open and closed position using an actuator (not shown).

In one configuration, the carriers 101 are supported above the bottom of each of the substrate sub-chambers 1120, 1122, 1124 by a plurality of substrate supports 1144, which are configured and spaced at an elevation with the chamber body 1112 or the horizontal walls 1114.

Figure 12A:
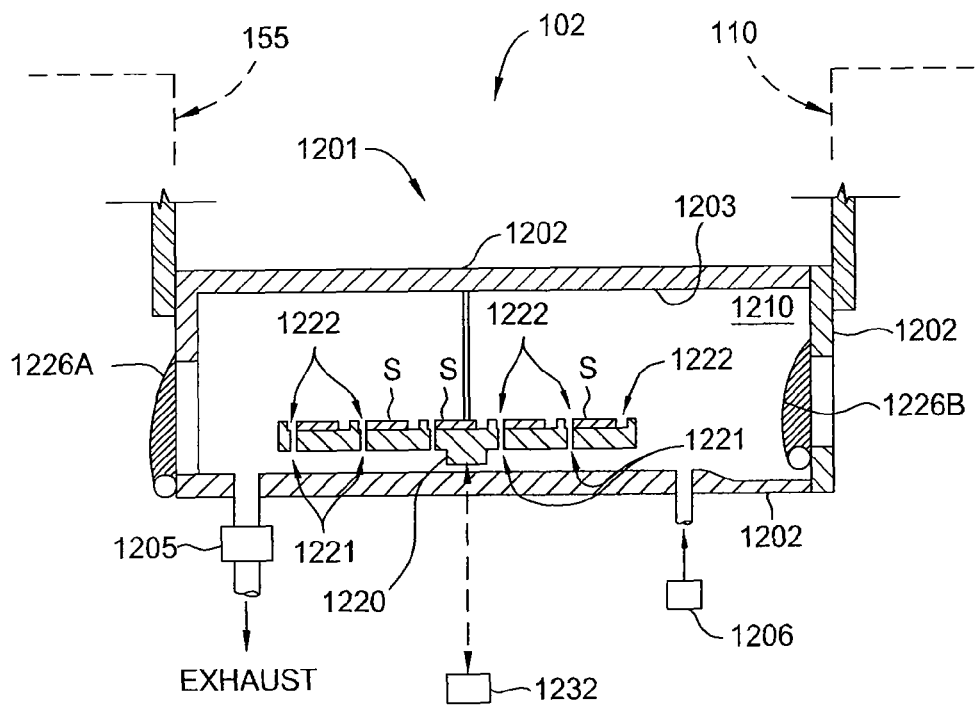
FIGS. 12A-12B are schematic cross-sectional views of a load lock chamber according to one embodiment described herein.
Figure 12B:
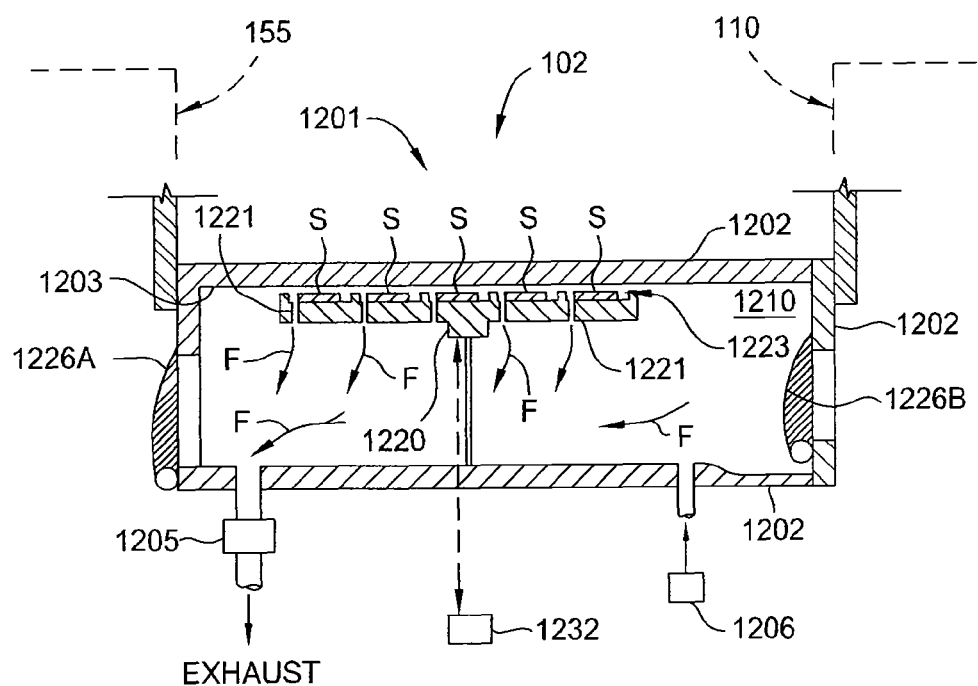

Due to the typical fragile nature of crystalline solar cell substrates and the need for a repeatable robotic transfer process, it is often desirable to assure that the solar cell substrates S not move relative to the carrier 101, or other supporting components, during the pump down or the venting cycles performed within the load lock chamber 102. The movement of the substrates S is believed to be caused by the movement of gas atoms relative to the substrate surface during the pump down or venting cycles. FIGS. 12A-12B illustrate one embodiment of a substrate sub-chamber 1201 and a method of using the substrate sub-chamber 1201 to allow a processing region 1210 to be rapidly pumped-down to a vacuum pressure and rapidly vented-up to an atmospheric pressure without significant movement of the thin solar cell substrates S.

The substrate sub-chamber 1201 generally contains a plurality of walls 1202 that enclose the processing region 1210, two or more slit valves 1226A-1226B, a substrate support 1220, a pump 1205, and a chamber vent gas delivery system 1206. FIG. 12A illustrates one embodiment of the substrate sub-chamber 1201 in which the substrate support 1220 is in a retracted position so that it can receive substrates S from the various robotic elements contained within the processing system 100. The batch of substrates S can be transferred from the robot 111 (not shown) positioned in the transfer chamber 110, or in the substrate interface module 155, to the substrate support 1220, or vice versa, by use of a substrate lifting assembly (not shown) that is configured to support and position each of the substrates S. In one configuration, as shown in FIG. 12A, the substrates S are positioned within pockets 1222 formed on the substrate support 1220 to retain and support the substrates S during processing in the load lock chamber 102. The substrate sub-chamber 1201 may also include a bellows assembly (not shown) that forms a seal between one or more walls 1202 (i.e., back wall) and the substrate support 1220 to allow the substrate support 1220 to be desirably positioned within the processing region 1210 without affecting the vacuum pressure formed in the processing region 1210 by the pump 1205. In one configuration, the substrate support 1220 is positioned within the processing region 1210 by use of an actuator 1232.

FIG. 12B illustrates one configuration of the substrate sub-chamber 1201 in which the substrate support 1220 is positioned so that the substrates S are at least partially enclosed in an enclosed region 1223 to isolate them from the gas movement during the pump down (i.e., gas flow "F" in FIG. 12B) or venting cycles. In one example, the enclosed region 1223 comprises the space formed between the walls 1202, pockets 1222, and substrates S, which is created by positioning the substrate support 1220 near a surface 1203 of a wall 1202. In this configuration, during the venting and pump down steps, the substrates S, which are positioned on the substrate support 1220, are isolated from the bulk of the gas movement in the processing region 1210 during these cycles. In one embodiment, it is desirable to form a plurality of holes 1221 within the substrate support 1220 to allow the movement of gas atoms to or from the enclosed region 1223 to be controlled during the venting or pump down cycle. In one embodiment, the size, aspect ratio and number of holes 1221 formed within the substrate support 1220 is designed to control the flow of gas from one side of the substrate support 1220 to the other. In one embodiment, pockets (e.g., reference number 1222) are formed in the surface 1203 of the one or more of the walls 1202, rather than on the substrate support 1220, so that each substrate S can be isolated from other substrates when the enclosed region 1223 is formed.

Therefore, by use of the method and apparatus discussed in relation to FIGS. 12A and 12B, the processing region 1210 can be rapidly pumped down or vented to improve substrate throughput, without damaging or moving the substrates S from a desired position on the substrate support 1220. When the base pressure of the substrate sub-chamber 1201 is low enough, for example, about 1 Torr, the substrate support 1220 and/or carrier 101 can be returned to the retracted position (FIG. 12A) since it is believed that the movement of gas atoms in the processing region 1210 at these pressures is generally not able to affect the substrate position on the substrate support 1220. Moving the substrate support 1220 after the desired pressure has been reached allows the transfer robot 111 in the transfer chamber 110 to enter and receive the substrates S from the substrate support 1220, without waiting for the substrate support 1220 to be moved until after a desired base pressure (e.g., ~$10^{-3}$ to $10^{-6}$ Torr) has been reached. Similarly, during a venting cycle when the pressure within the substrate sub-chamber 1201 is close enough to atmospheric pressure so that significant turbulence in the processing region 1210 does not exist, the substrate support 1220 can be returned to the retracted position to allow the transfer robot 111 in the substrate interface module 155 to enter and receive the substrates S.

Processing Chamber Configuration

Figure 13:
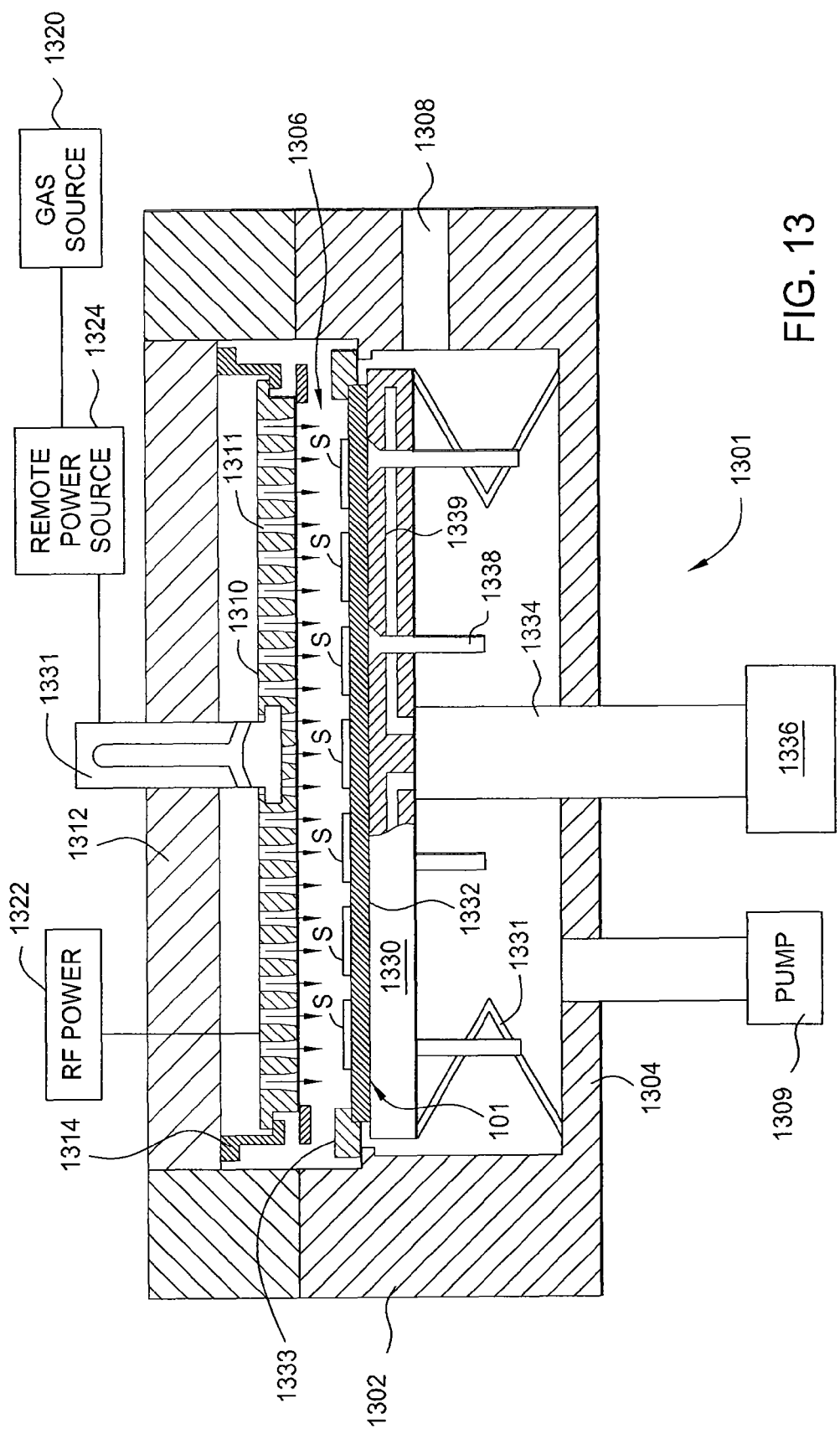
FIG. 13 is a schematic cross-section view of a processing chamber according to one embodiment described herein.

FIG. 13 is a schematic cross-section view of one embodiment of a processing chamber, such as a PECVD chamber 1301 in which one or more films can be deposited on each of the substrates S in the batch. In one configuration, the PECVD chamber 1301 is adapted to deposit one or more layers on each of the substrates S that are disposed on a carrier 101, as shown in FIG. 13. One suitable plasma enhanced chemical vapor deposition chamber is available from Applied Materials, Inc., located in Santa Clara, Calif. It is contemplated that other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention. In one embodiment, the chamber 1301 generally includes walls 1302, a bottom 1304, and a showerhead 1310, and substrate support 1330 which define a process volume 1306. The process volume is accessed through a valve 1308 such that the batch of substrates S, such as a plurality of substrates S disposed on a substrate carrier 101, may be transferred in and out of the PECVD chamber 1301. The substrate support 1330 includes a substrate receiving surface 1332 for supporting substrates S and a stem 1334 coupled to a lift system 1336 to raise and lower the substrate support 1330. A shadow frame 1333 may be optionally placed over periphery of the carrier 101 that may already have one or more layers formed thereon. Lift pins 1338 are moveably disposed through the substrate support 1330 to move the carrier 101, or the plurality of substrates S in a carrier-less system, to and from the substrate receiving surface 1332. The substrate support 1330 may also include heating and/or cooling elements 1339 to maintain the substrate support 1330 at a desired temperature.

The showerhead 1310 is coupled to a backing plate 1312 at its periphery by a suspension 1314. A gas source 1320 is coupled to the backing plate 1312 to provide gas through the backing plate 1312 and through the plurality of holes 1311 in the showerhead 1310 to the substrate receiving surface 1332. A vacuum pump 1309 is coupled to the PECVD chamber 1301 to control the process volume 1306 at a desired pressure. An RF power source 1322 is coupled to the backing plate 1312 and/or to the showerhead 1310 to provide RF power to the showerhead 1310 so that an electric field is created between the showerhead 1310 and the substrate support 1330 so that a plasma may be generated from the gases between the showerhead 1310 and the substrate support 1330. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 1324, such as an inductively coupled remote plasma source, may also be coupled between the gas source and the backing plate. Between processing batches of substrates, a cleaning gas may be provided to the remote plasma source 1324 so that remote plasma is generated and provided to clean chamber components. The cleaning gas may be further excited by the RF power source 1322 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al., which is incorporated by reference to the extent not inconsistent with the present disclosure.

Passivation Layer Deposition

The following examples describe passivation layer deposition processes that may be performed during solar cell formation in one or more of the processing chambers (103-108), such as the processing chamber illustrated and described with respect to FIG. 13. In one embodiment, a process for depositing a hydrogenated SiN layer on solar cell substrates S may be performed using a hydrogen dilution process as follows.

After the substrates S are positioned in the one of the processing chambers 103-108 in the processing system 100, a process gas mixture is flowed into the chamber. The process gas mixture includes a precursor gas mixture and a hydrogen gas ($H_2$) diluent. The hydrogen gas diluent may have a flow rate as high as approximately two times the flow rate of the precursor gas mixture. The precursor gas mixture may be a combination of silane ($SiH_4$) and nitrogen ($N_2$), silane and ammonia ($NH_3$), or silane, ammonia, and nitrogen. In one example, flow rates for a process gas mixture containing silane, ammonia, and hydrogen may be 3.5 sccm, 50 sccm, and 80 sccm, per liter of chamber volume, respectively. Flow rates for a process gas mixture containing silane, ammonia, nitrogen, and hydrogen may be 5 sccm, 16 sccm, 40 sccm, and 80 sccm, per liter of chamber volume, respectively.

Next, plasma is generated in the processing chamber 103-108 to deposit a SiN layer on the substrates S, wherein the SiN layer is suitable for use as a combined ARC and passivation layer for a solar cell. Namely, the SiN layer so deposited has a mass density of between about 2.6 and 2.8 $g/cm^3$, a refractive index of between about 2.0 and 2.2, and a hydrogen concentration of between about 5 atomic percent and 15 atomic percent. In one embodiment, a chamber pressure of 1.5 Torr may be maintained in the chamber and RF power intensity of 0.54 $W/cm^2$ at a frequency of 13.56 MHz may be applied to the electrodes of the chamber to generate the plasma. Alternatively, low frequency RF power, e.g., 400 kHz, may instead be applied to the electrodes.

In another example, a process for depositing a hydrogenated SiN layer on a solar cell substrate using an ammonia-free precursor gas mixture is provided. After the substrates S are positioned in the second of the chambers 103-108 in the processing system 100, a process gas mixture is flowed into the chamber. The process gas mixture includes silane ($SiH_4$) and nitrogen ($N_2$) as precursor gases, and is free of ammonia ($NH_3$). The process gas mixture, according to one aspect, may have substantially the same flow rate of nitrogen and silane as the nitrogen and silane flow rates of a conventional SiN process gas mixture. For example, a conventional SiN process gas mixture, i.e., one commonly used in PECVD chambers for forming a SiN passivation layer may contain 5.5 sccm of silane and 40 sccm of nitrogen, per liter of chamber volume. The process gas mixture, according to another aspect, may have a substantially higher nitrogen flow rate relative to the flow rate of silane, when compared to a corresponding conventional SiN process gas mixture. Hence, another process gas mixture may contain 3.5 sccm of silane and 95 sccm of nitrogen, per liter of chamber volume.

Next, plasma is generated in the processing chamber 103-108 to deposit a SiN layer on the substrates S in a manner substantially the same a described above in the previous example. As with the previous example, the SiN layer so deposited is suitable for use as a combined ARC and passivation layer for a solar cell.

In another example, a process for depositing a SiN dual stack film on a solar cell substrate is provided. After the substrates S have been positioned in the processing chamber 103-108, a first process gas mixture is flowed into the chamber. The first process gas mixture may be on of the gas mixtures described above. Next, plasma is generated in the processing chamber 103-108 to deposit a SiN interface layer on the substrates S substantially the same as described above.

Next, flow of the first process gas mixture is stopped, and a second process gas mixture is flowed into the chamber. The second process gas mixture may be a conventional SiN process gas mixture, i.e., one commonly used in PECVD systems for forming a SiN passivation layer on large area substrates, such as flat panel displays. In one example, the second process gas mixture may contain 5.5 sccm of silane ($SiH_4$), 16 sccm of ammonia ($NH_3$), and 40 sccm of nitrogen ($N_2$), per liter of chamber volume. Optionally, plasma may be extinguished in the chamber after flow of the first process gas mixture is stopped and prior to the introduction of the second process gas mixture. In this case, the first process gas mixture may be substantially purged from the chamber before the second process gas mixture is flowed into the chamber.

Finally, a bulk SiN layer is deposited on the interface layer to form a dual stack SiN ARC/passivation layer on the substrates S. In this way, the majority of the SiN passivation layer may be deposited by a substantially faster process without affecting the quality of solar cell passivation. If plasma is extinguished in the chamber prior to the introduction of the second process gas mixture, then plasma is re-ignited to enable deposition of the bulk SiN layer.

While the foregoing is directed to embodiments of the present invention, other and further embodiments of the invention may be devised without departing from the basic scope thereof, and the scope thereof is determined by the claims that follow.

The invention claimed is:

1. A processing system, comprising:
   a transfer chamber having a first transfer robot disposed therein, wherein the first transfer robot is configured to transfer an array of substrates;
   a first process chamber coupled to the transfer chamber and having a substrate supporting surface configured to receive the array of substrates from the first transfer robot;
   a second process chamber coupled to the transfer chamber and having a substrate supporting surface configured to receive the array of substrates from the first transfer robot;
   a load lock chamber coupled to the transfer chamber and having one or more regions with a substrate supporting surface configured to receive the array of substrates from the first transfer robot; and
   a substrate interface module having a second transfer robot configured to transfer the array of substrates between the substrate interface module and the one or more regions of the load lock chamber.

2. The processing system of claim 1, further comprising one or more robots disposed in the substrate interface module and configured to transfer substrates from an inlet region disposed adjacent the substrate interface module to the second transfer robot.

3. The processing system of claim 1, further comprising a substrate carrier having recesses disposed to retain each substrate of the array within the processing system.

4. The processing system of claim 1, wherein the array of substrates total at least 30 substrates.

5. The processing system of claim 1, wherein the first and second transfer robots each have an end effector with a plurality of elements configured to retain the array of substrates during transfer.

6. The processing system of claim 1, further comprising a loading module positioned adjacent the substrate interface module, wherein the loading module has one or more robots disposed therein and configured to transfer substrates from an input region positioned adjacent the loading module into the loading module.

7. The processing system of claim 1, further comprising a substrate reorientation chamber coupled to the transfer chamber and having a flipping device configured to receive the array of substrates from the first transfer robot with each of the substrates having a first side facing upwardly and simultaneously reorient the array of substrates such that the first side faces downwardly.

8. The processing system of claim 1, wherein the substrate supporting surface of the load lock chamber has a plurality of apertures disposed therethrough and the load lock chamber further comprises an actuator that is adapted to move the substrate supporting surface from a first position adjacent a bottom wall of the load lock chamber to a second position adjacent a top wall of the load lock chamber while pressure in the load lock chamber is being altered.

9. The processing system of claim 2, further comprising:
   a second load lock chamber coupled to the transfer chamber and having one or more regions with a substrate supporting surface configured to receive the array of substrates from the first transfer robot; and
   a second substrate interface module having a third transfer robot configured to transfer the array of substrates between the second substrate interface module and the one or more regions of the second load lock chamber, wherein the second substrate interface module has one or more robots disposed therein and configured to transfer substrates from the third transfer robot to an outlet region disposed adjacent the second substrate interface module.

10. The processing system of claim 6, further comprising an unloading module positioned adjacent the substrate interface module, wherein the unloading module has one or more robots disposed therein and configured to transfer substrates arranged in an array from the unloading module to an exit region positioned adjacent the unloading module.

11. The processing system of claim 10, further comprising an inlet conveyor positioned to deliver substrates to the input region and an outlet conveyor positioned to remove substrates from the exit region.

12. The processing system of claim 11, wherein the inlet conveyor and the exit conveyor are linked together to form a continuous conveyor.

13. A processing system, comprising:
   a first transfer chamber having a first transfer robot disposed therein, wherein the first transfer robot is configured to transfer an array of substrates;

a first process chamber coupled to the first transfer chamber and having a substrate supporting surface configured to receive the array of substrates from the first transfer robot;

a second process chamber coupled to the first transfer chamber and having a substrate supporting surface configured to receive the array of substrates from the first transfer robot;

a second transfer chamber having a second transfer robot disposed therein, wherein the second transfer robot is configured to transfer the array of substrates;

a pass through chamber coupling the first transfer chamber and the second transfer chamber, wherein each of the first and second transfer robots is configured to transfer the array of substrates to the pass through chamber and receive the array of substrates from the pass through chamber;

a load lock chamber coupled to the first transfer chamber and having one or more regions with a substrate supporting surface configured to receive the array of substrates from the first transfer robot; and a substrate interface module having a third transfer robot configured to transfer the array of substrates between the substrate interface module and the one or more regions of the load lock chamber.

14. The processing system of claim 13, further comprising:

a second load lock chamber coupled to the second transfer chamber and having one or more regions with a substrate supporting surface configured to receive the array of substrates from the second transfer robot; and a second substrate interface module having a fourth transfer robot configured to transfer the array of substrates between the second interface module and the one or more regions of the second load lock chamber.

15. The processing system of claim 13, wherein the substrate supporting surface of the load lock chamber has a plurality of apertures disposed therethrough and the load lock chamber further comprises an actuator that is adapted to move the substrate supporting surface from a first position adjacent a bottom wall of the load lock chamber to a second position adjacent a top wall of the load lock chamber while pressure in the load lock chamber is being altered.

16. The processing system of claim 14, wherein the first and second transfer robots are configured to reorient each substrate of the array of substrates from a first orientation having a first side facing upwardly to a second orientation having the first side facing downwardly within the pass through chamber.

17. The processing system of claim 14, wherein the pass through chamber is configured to receive the array of substrates with each substrate having a first side facing upwardly and reorient each substrate such that the first side faces downwardly.

18. The processing system of claim 14, further comprising a substrate carrier having recesses disposed to retain each substrate of the array within the processing system.

19. The processing system of claim 14, wherein the first, second, third, and fourth transfer robots each have an end effector with a plurality of elements configured to retain the array of substrates during transfer.

20. A method of forming a solar cell device, comprising:

positioning an array of substrates on an end effector of a transfer robot within a transfer chamber;

transferring the array of substrates into a first processing chamber coupled to the transfer chamber;

processing a first side of each of the array of substrates in the first processing chamber;

transferring the array of substrates into a reorientation chamber coupled to the transfer chamber;

substantially simultaneously reorienting each substrate such that the first side faces downwardly;

transferring the array of substrates into a second processing chamber coupled to the transfer chamber;

processing a second side of each of the array of substrates in the second processing chamber.

21. The method of claim 20, further comprising:

transferring the array of substrates into a third processing chamber coupled to the transfer chamber prior to transferring the array of substrates into the reorientation chamber;

processing the first side of each of the array of substrates in the third processing chamber.

22. The method of claim 21, wherein the first, second, and third processing chambers are selected from the group consisting of physical vapor deposition chambers, plasma enhanced chemical vapor deposition chambers, hot wire chemical vapor deposition chambers, plasma nitridation chambers, ion implant/doping chambers, atomic layer deposition chambers, plasma etching chambers, annealing chambers, rapid thermal oxidation chambers, rapid thermal annealing chambers, laser annealing chambers, rapid thermal nitridation chambers, vapor etching chambers, and plasma cleaning chambers.

23. The method of claim 21, wherein positioning the array of substrates on the end effector comprises:

positioning the array of substrates on a substrate carrier; and positioning the substrate carrier on the end effector.

24. The method of claim 21, further comprising transferring the array of substrates onto a substrate supporting surface within a load lock chamber coupled to the transfer chamber prior to positioning the array of substrates on the end effector.

25. The method of claim 24, further comprising:

raising the substrate supporting surface to a position wherein the array of substrates are substantially adjacent a top wall of the load lock chamber;

altering the pressure in the load lock chamber; and lowering the substrate supporting surface to a position substantially adjacent a bottom wall.

* * * * *